United States Patent [19]

Bailey

[11] Patent Number: 5,667,538

[45] Date of Patent: Sep. 16, 1997

[54] ELECTROCHROMIC THIN FILM STATE-OF-CHARGE DETECTOR FOR ON-THE-CELL APPLICATION

[75] Inventor: John C. Bailey, Columbia Station, Ohio

[73] Assignee: Eveready Battery Company, Inc., Westlake, Ohio

[21] Appl. No.: 482,467

[22] Filed: Jun. 8, 1995

Related U.S. Application Data

[62] Division of Ser. No. 246,926, May 20, 1994, Pat. No. 5,458,992, which is a continuation of Ser. No. 648,080, Jan. 31, 1991, abandoned.

[51] Int. Cl.$^6$ ................................................. H01M 10/48
[52] U.S. Cl. ......................... 29/623.5; 359/271; 429/93
[58] Field of Search .................... 429/91–93; 359/271; 29/623.4, 623.5

[56] References Cited

U.S. PATENT DOCUMENTS

| | | |
|---|---|---|
| 945,564 | 1/1910 | Marko . |
| 1,497,388 | 6/1924 | Sterling . |
| 3,280,701 | 10/1966 | Donnelly et al. . |
| 3,667,039 | 5/1972 | Garfein et al. . |
| 4,304,465 | 12/1981 | Diaz . |
| 4,379,816 | 4/1983 | Mullersman et al. . |
| 4,448,493 | 5/1984 | Matsudaira et al. ............... 429/191 X |
| 4,497,881 | 2/1985 | Bertolino . |

(List continued on next page.)

FOREIGN PATENT DOCUMENTS

| | | |
|---|---|---|
| 60-66170 | 4/1985 | Japan . |
| 63-179269 | 7/1988 | Japan . |
| 2-41365 | 9/1988 | Japan . |
| 63-213256 | 9/1988 | Japan . |
| 2-100269 | 4/1990 | Japan . |
| WO92/03852 | 3/1992 | WIPO . |
| WO93/06474 | 4/1993 | WIPO . |
| WO94/15246 | 7/1994 | WIPO . |

OTHER PUBLICATIONS

My T. Nguyên and Lê H. Dao, "Poly(N–Benzylaniline)/(Poly(AMPS)/WO$_3$) Solid–State Electrochromic Cell," *J. Electrochem. Soc.*, vol. 136, No. 7, pp. 2131–2132 (Jul. 1989).

M. K. Carpenter & D. A. Corrigan, *Proceedings of the Symposium on Electrochromic Materials*, vol. 90–2, Editors, The Electrochemical Society, Inc., Pennington, N.J., 1990; and.

C. M. Lampert and C. G. Granqvist, *Large–Area Chromogenics: Materials and Devices for Transmittance Control*, vol. IS4, Editors, SPIE Optical Engineering Press, Bellingham, Washington, Sep. 22–24, 1988.

*Primary Examiner*—Stephen Kalafut
*Attorney, Agent, or Firm*—Robert W. Welsh

[57] ABSTRACT

A tester for use in determining the voltage and state-of-charge of a battery. The tester can be permanently mounted on the battery and employs an electrochromic cell which changes visual appearance, for example, color or intensity of color when electrically connected across the terminals of a battery. The electrochromic cell undergoes an oxidation/reduction reaction on direct application of the DC potential of the battery. The color of the electrochromic cell can be compared with a color comparison chart to determine the condition of the battery.

The tester can be permanently electrically connected to the battery or, preferably, can be connected momentarily to determine the state of the battery.

19 Claims, 2 Drawing Sheets

U.S. PATENT DOCUMENTS

| | | |
|---|---|---|
| 4,702,563 | 10/1987 | Parker . |
| 4,702,564 | 10/1987 | Parker . |
| 4,723,656 | 2/1988 | Kiernan et al. . |
| 4,726,661 | 2/1988 | Parker . |
| 4,737,020 | 4/1988 | Parker . |
| 4,801,514 | 1/1989 | Will et al. . |
| 4,835,475 | 5/1989 | Hanakura et al. . |
| 4,835,476 | 5/1989 | Kurosawa . |
| 4,902,108 | 2/1990 | Byker . |
| 4,911,994 | 3/1990 | Will et al. . |
| 4,917,973 | 4/1990 | Yoshimoto et al. . |
| 5,015,544 | 5/1991 | Burroughs et al. ............... 429/93 |
| 5,059,895 | 10/1991 | Cataldi et al. . |
| 5,250,905 | 10/1993 | Kuo et al. ............... 429/91 X |
| 5,256,500 | 10/1993 | Ishimoto . |
| 5,339,024 | 8/1994 | Kuo et al. . |
| 5,396,177 | 3/1995 | Kuo et al. . |

ELECTROCHROMIC THIN FILM STATE-OF-CHARGE DETECTOR FOR ON-THE-CELL APPLICATION

This is a divisional of application Ser. No. 08/246,926 filed May 20, 1994, now U.S. Pat. No. 5,458,992 which is a continuation of Ser. No. 07/648,080 filed Jan. 31, 1991, now abandoned.

BACKGROUND OF THE INVENTION

Since the original manufacture of dry cells or batteries, a user cannot tell from looking at them whether they have little useful life left or whether they are fresh. A completely discharged battery and a new one present the same physical appearance. To determine the usefulness of a battery, one would think that one could simply put the battery into a device and operate the device. Very few devices, however, work with only one battery and if a new battery and a discharged battery, or a nearly discharged battery, are put into a device such as a flashlight, the flashlight will glow very dimly, if at all. The conclusion, then, is that the batteries are all defective and should be replaced when, in fact, one of the batteries might be a fresh battery.

In order to test the cells, one can use relatively expensive testing equipment such as a voltmeter or an ammeter but this is an inordinate expense in comparison to the cost of a new set of batteries.

There are other proposals for testing batteries. For example, U.S. Pat. No. 4,723,656 issued Feb. 9, 1988, to Kiernan et al. discloses a blister-type package for new batteries with a battery condition indicator built into the blister portion of the package. The blister can be deformed to place the tester across the terminals of a battery to be tested. A thermochromic liquid crystal material is employed in the tester in combination with a wedge-shaped resistive element. As the current flows through the resistive element, a thermal front will move away from the narrowest portion of the wedge to an extent depending on the capacity of the battery. The effect of the thermal front moving can be seen in the liquid crystal layer in thermal contact with the resistive element.

Several patents have been issued to Robert Parker, for example, U.S. Pat. Nos. 4,702,563; 4,702,564; 4,726,661 and 4,737,020 relating to the use of a heat generating pattern on a flexible substrate in combination with a thermochromic liquid crystal layer to determine the state-of-charge of a battery. Attempts have even been made to view the contents of the cell while in use and to detect a color change in the working components of the cell to determine the state of the cell, for example U.S. Pat. No. 4,497,881 issued Feb. 5, 1985, to Bertolino. U.S. Pat. No. 3,667,039 issued to Garfein et al. on May 30, 1972, discloses the use of liquid crystal materials in a closed cell having either a shaped electrode or a shaped cell in order to provide a field gradient across the liquid crystal material. The cell is then connected across the terminals of a battery and the state of the battery is determined by noting the location of a visible gradient in the liquid crystal material and reading from an accompanying scale the status of the battery.

U.S. Pat. No. 4,835,476 issued to Kurosawa discloses heat sensitive dye systems using organic materials such as crystal violet lactone in combination with other reactive materials to form compositions which decolorize on application of the heat produced by current flowing through a resistive element connected between the terminals of a battery. When the coating material decolorizes, a scale beneath the coating becomes visible indicating the status of the battery.

It can be seen from the above discussion that most attempts in the past have used thermochromic materials, that is, materials which undergo a change in color or color intensity on the application of heat. Since heat is used to change the color of the material, it is important that the heat not be drawn away from the measuring device. It has, therefore, not been practical to employ such devices attached directly to the dry cell or battery to be tested. The large thermal mass presented by the battery acts as a heat sink drawing the heat away causing the measuring device to read inaccurately. A battery condition tester has long been desired for incorporation on the cell or battery rather than on the battery package. Such an on-the-cell tester would be more convenient for the customer since it would be an integral part of the cell or battery and would not be discarded with the original battery package.

SUMMARY OF THE INVENTION

In accordance with the present invention, a combined battery and battery tester is provided. A housing contains the active components of the battery and has a pair of external terminals. A tester for the battery is disposed on the housing. The tester includes a working electrode comprising an electronic conductor and an electrochromic material that undergoes a visible change as a result of a redox chemical reaction. An ionically conducting electrolyte is in contact with the working electrode. A counter electrode is in electrical contact with the electrolyte layer. The visible change in the electrochromic material is visible through the working or counter electrode. A pair of electrical conductors are provided for connecting the working and counter electrodes to the external terminals of the battery for testing the battery.

A measuring device is provided for detecting and measuring the state-of-charge of a cell or battery. The device employs an electrochromic material. The electrochromic material changes color (change in light absorption) as the material changes oxidation state, a redox-type reaction, under the influence of a DC potential applied directly to the electrochromic material. The electrochromic material may be a solid, a solid in solution or a liquid in a liquid solution. Solution devices are sometimes referred to as electrochemichromic devices. The measuring device can be applied to the battery housing, the label on the housing or the end covers to measure the state-of-charge of the cell.

DETAILED DESCRIPTION OF THE PREFERRED EMBODIMENTS

Figure 1:
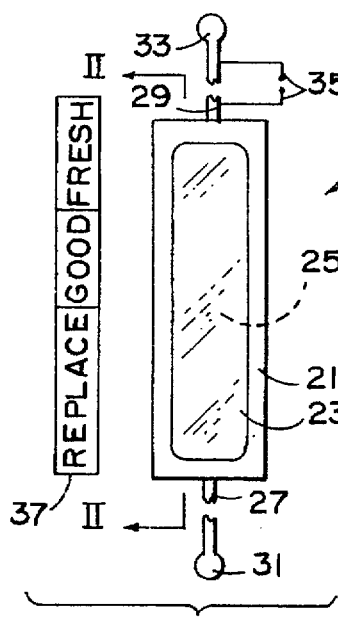
FIG. 1 is a schematic elevational view of the battery tester of the present invention accompanied by a scale for comparing the color of the indicating device and determining the state of charge of the cell.

Referring to FIG. 1, a typical electrochromic state of battery charge determining device is shown and indicated generally by the number 20. The device has a transparent cover 21 for containing the several components of the measuring device. The cover 21 has a window or top surface 23 through which the electrochromic material 25 can be viewed. Electrical conductors 27 and 29 extend from each end of the measuring device. The conductor 27 is shown as being of indeterminate length and has a terminal 31 for connection to an external terminal of a battery. Likewise, the conductor 29 is shown of indeterminate length and has a terminal 33 for connection to the opposite terminal of the battery to be measured. A switch is schematically illustrated at 35 which can be used to connect the measuring device 20 across the terminals of a battery being tested. A color scale 37 can be mounted on the housing of the battery 20 for providing a ready color comparison for the electrochromic material to determine the state-of-charge of the battery.

Figure 2:
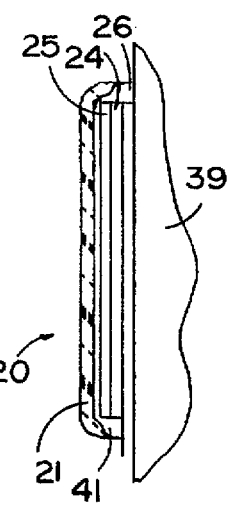
FIG. 2 is a sectional view taken along the line II—II of FIG. 1.

In FIG. 2, the state-of-charge indicator 20 is shown mounted on a battery 39, only a portion of which is shown. In the example shown here, the indicator comprises a cover 21, a counter electrode 26, an ionically conducting electrolyte layer 24, and the electrochromic working electrode which comprises conductive electrode 41 and electrochromic material 25. Counter electrode 26 can be part of the battery label or the battery housing. An electronically conductive electrode 41, which is at least partially optically transparent, is coated on the inner surface of cover 21. Alternative modifications of this construction will be apparent to those skilled in the art. For example, one or more electrochromic materials, which can be the same of different materials, can be deposited or coated on both the transparent electrode 41 and counter electrode 26, which can be nontransparent. A further modification involves coating or depositing an electrochromic material 25 on electrode 26 which then becomes the electrochromic working electrode. Further modifications of electrochromic cell construction can be found in *Proc. Syposium on Electrochromic Materials*, Vol. 90-2, M.K. Carpenter & D. A. Corrigan, Editors, The Electrochemical Society, Princeton, N.J., 1990, or in *Large Area Chromogenics: Materials and Devices for Transmittance Control*, C. M. Lampert and C. G. Granqvist, Editors, Optical Engineering Press, Bellingham, Wash., 1989.

The transparent electronic conductor 41 can be made of a thin metal layer or metal oxide such as doped substoichiometric oxides of indium, tin, cadmium or zinc, e.g., a fluorine- or antimony-doped tin oxide, as long as the transparent conductive material is compatible with the components of the electrochromic cell. The preparation and application of such transparent electrically conductive films is well-known in the art. A description of such transparent electrical conductors is given in the article by Niall R. Lynam entitled "Transparent Electronic Conductors," *Proc. Symposium on Electronic Materials*, Vo. 90-2, M. K. Carpenter & D. A. Corrigan, Editors, The Electrochemical Society, Princeton, N.J., 1990.

If the electrochromic materials used in the cell have suitable electrical conductivity, they can function both as one of the electrically conductive electrodes in the electrochromic cell and as the material undergoing the redox reaction and exhibiting color development or change.

The electrolyte materials suitable for use in the electrochromic cell may be inorganic or organic, liquid or solid, or combinations thereof, e.g., polymer electrolyte materials such as poly-2-acrylamido-2-methyl propanesulfonic acid [poly(AMPS)].

The cover 21 can be made of any of the well-known transparent plastic materials such as polyvinyl chloride, polyvinylidene chloride, polyethylene, polyesters and the like.

The electrochromic material used in the state-of-charge measuring cell can be either an organic or an inorganic material which changes color or color intensity, that is, optical absorption, on application of a DC potential. The active material in the electrochromic cell undergoes an oxidation/reduction reaction, commonly referred to as a redox reaction, in order to develop or change color. The optical absorptivity of the cell is controlled by driving an electrode from one state to another with an external power source.

In some cases, the electrochromic material itself may not undergo the redox reaction but may react with a redox product to produce a color change. An example of such a system is the production of $OH^-$ electrochemically followed by the reaction of the $OH^-$ with an organic pH indicating dye to give a color change. This type of electrochromic system is the subject of U.S. Pat. No. 3,280,701 by J. F. Donnelly and R. C. Cooper.

Electrochromic materials which show a very large change in extinction coefficient are preferred so that very little electrode material (and hence a very small amount of current) is required to produce a visible color change. This is in contrast to thermochromic liquid crystal materials which develop a change in color when a phase change takes place such as going from a solid to a liquid crystal phase.

Inorganic electrochromic materials are represented by $WO_3$, $MoO_3$, $TiO_2$, $SnO_2$, $Cr_2O_3$, $NiO_2$, $MnO_2$, $Mn_2O_3$ and Prussian blue which are typical of many well-known solid inorganic electrochromic materials. Such materials have been studied extensively in applications such as optical filters, one-way glass, and variable reflectance mirrors. These materials can be used in a solid form as a coating applied to the transparent conductive coating on the interior of the cover of the device.

EXAMPLE 1

A tungsten-containing compound was prepared by electrolysis of an aqueous mixture of potassium tungstate, $K_3WO_4$, and oxalic acid, $H_2C_2O_4$. The compound was deposited by electrolysis onto an optically transparent electronically conductive coating previously deposited on a plastic substrate. This compound can function in the same manner as $WO_3$ which, as pointed out above, is a well-known electrochromic material but which cannot be readily obtained commercially as a film. The deep blue electrochromic films obtained by the $K_2WO_4$—$H_2C_2O_4$ reaction could be cycled in 0.1N sulfuric acid and appeared to be stable after 200 cycles at 3 Hz between 0.0 to −0.4 volt vs a saturated calomel reference electrode (SCE). This material is colorless at potentials more positive than −0.1 volt and blue at potentials more negative than −0.3 volt vs SCE. The intensity of the blue color increased as the potential was decreased to −0.8 volt.

Representative of solid organic electrochromic materials include many macrocyclic and polycyclic materials such as metal phthalocyanines, polypyrrole and polyaniline and common dyes and redox indicators such as naphthol blue black and N,N'-diphenylbenzidine. These materials can be applied in solid form as a film on the transparent conductive layer on the inside of the cover of the device.

One such solid material, N-Benzylaniline, was selected as an example of an organic material which can be polymerized electrochemically to produce conductive electrochromic films.

EXAMPLE 2

The electrochromic electrode was prepared by electrolysis of a 0.1M N-Benzylaniline in 1.0M phosphoric acid as described by Nguyen and Dao in *J. Electrochem. Soc.*, 136, 2131 (1989), Poly(N-Benzylaniline/(Poly(AMPS)/WO$_3$ Solid-State Electrochromic Cell. The film prepared by this method could be cycled in 0.05M sulfuric acid from a deep blue/green at 0.8 volt to a transparent yellow at 0.2 volt vs SCE reference. This electrode was cycled 200 times at 3 Hz without apparent degradation.

The working electrode comprising conductive electrode 41 and electrochromic material 25 of the electrochromic cell shown in FIG. 2 is placed so that it is in contact with an ionically conductive layer 24. This layer 24 is also in contact with the counter electrode. Since the state-of-charge measuring device is to be applied directly to the battery housing or end cover, the counter electrode does not have to be transparent.

The counter electrode 26 in the electrochromic cell is an electronic conductor and can be a metal, a metal oxide or an organic conductor. It can also be made of, or contain a coating of, an electrochromic material, or a combination of the aforementioned materials, e.g., a coating of an electrochromic material on a metal or a metal oxide. The main requirement for the counter electrode in the electrochromic state-of-charge indicator is that it poise the overall electrochromic cell potential at the correct level for the cell or battery to be tested. The potential may be the result of an electrochemical couple intentionally added or an adventitious impurity.

In addition to the systems using solid electrochromic materials and an electrolyte, as mentioned above, the use of systems employing a single layer functioning as both the electrochromic material and the electrolyte, i.e., electrochemichromic systems, is contemplated. In this modification, the electrochemichromic material includes an anodic component and a cathodic component which undergo oxidation and reduction at the respective electrodes. Both the anodic and cathodic components may contribute to the observed color change and each electrode may function as a "working electrode" and a "counter electrode." Both electrodes (the electronic conductors at which the electrochemical reactions take place) can be made of the same or different material however, at least one electrode must be at least partially transparent to permit observation of the visible change in the electrochromic material. Materials such as standard pH or redox indicators, e.g., phenolphthalein, methyl violet, ethyl red, methylene blue, N,N'-diphenylbenzidine, naphthol blue black or N,N-dimethylindoaniline can be used. Further examples of such electrochemichromic systems can be found in U.S. Pat. No. 4,902,108 issued Feb. 20, 1990, to Harlan J. Byker, which is incorporated herein by reference. These include N,N,N',N'-tetramethyl-1,4-phenylenediamine; 5,10-dihydro-5,10-dimethylphenazine and N,N',N''- trimethyltriphenazinoxazine. Phenolphthalein, methyl violet or ethyl red provide an indicative color change through the oxidation and reduction of the solvent (e.g., H$_2$O). As described above, the indicator material does not itself undergo a redox reaction but instead reacts with another species, e.g., protons from water, which are produced by the redox reaction.

When the electrochemichromic materials do not form suitably ionically conductive solutions, a small amount of a compatible electrolyte material can be added. The electrochemichromic solution can also be thickened by using polymeric thickeners such as polymethylmethacrylate, polyethylene oxide, poly-2-acrylamido-2-methyl propanesulfonic acid [poly(AMPS)] or the like.

Figure 3:
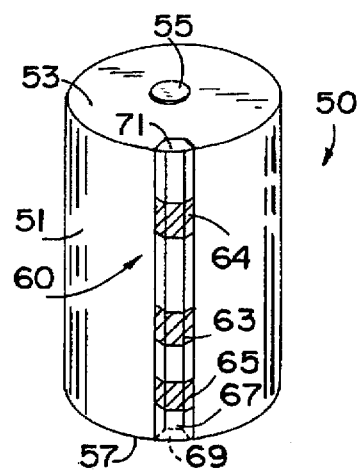
FIG. 3 is a perspective view of a battery having the measuring device mounted on the housing.

Referring to FIG. 3, a typical C or D size dry cell battery is shown and indicated generally by the number 50. A typical battery has a cylindrical housing 51 and an end cover 53 in contact with positive terminal 55. The opposite end cover is indicated by 57. On the side of housing 51 is an electrochromic state-of-charge tester indicated by the number 60. The battery testing device can have one or more electrochromic cells, for example three cells, similar to cell 20 of FIG. 1. Cell 64 can have an electrochromic composition contained therein and be poised to indicate a fresh battery. Cell 63 can be of a similar construction, however, having a different electrochromic cell material and being poised to indicate a good condition of the battery, while cell 65 is again of similar construction with a different electrochromic material which indicates that the battery should be replaced. Cell 65 is connected to the negative end cover 57 by means of a conductive strip of material 67 which is folded under and has a contact 69. At the opposite end of the tester, a conductor 71 completes the connection to the positive terminal of the battery. Alternative means of making contact between the electrochromic cell or cells and the battery terminals may be used. For example, one terminal of the electrochromic cell can be in direct contact with one of the battery terminals.

As shown in FIG. 3, the state-of-charge indicator is continuously in contact with the negative and positive external terminals of the battery. When used in such applications, it is preferred to use a solid state electrochromic cell, the layers of which are applied as coatings over the transparent conductor on the interior of the electrochromic cell cover. Solid state electrochromic cells tend to draw substantially less current than solution electrochromic or electrochemichromic materials. When the latter materials are used, it is preferred to use a suitable switch such as switch 35 (FIG. 1) to momentarily connect the battery testing device across the terminals of the battery and, after the reading is complete, the switch should be opened to electrically isolate the battery from the testing device.

Figure 4:
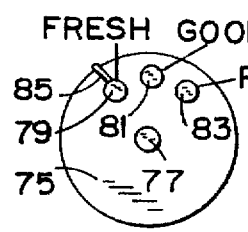
FIG. 4 is a plan view of an end cover for a battery showing a pattern of measuring devices.

FIG. 4 shows the end cover 75 of a battery having a terminal 77 and three electrochromic battery state-of-charge indicating devices 79, 81 and 83. The individual electrochromic cells are already connected to one terminal of the cell. A conductor, such as conductor 85, is electrically insulated from end cover 75 and contacts the opposite electrode within the electrochromic cell and the other external terminal of the battery. A similar contact means can also be provided for cells 81 and 83 (not shown to simplify the drawing). Electrochromic cells 79, 81 and 83 can be substantially similar to cells 64, 63 and 65, as shown in FIG. 3. Again, if a suitable solid state electrochromic cell is used, the cells can be left in continuous contact with the external terminals of the battery. If a solution electrochemichromic cell is used, it is preferred to provide a switch to electrically isolate the testing device until it is actually to be used for testing.

Figure 5:
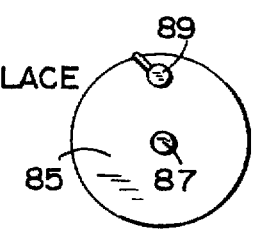
FIG. 5 shows an end cover with a single measuring devices.
Figure 6:
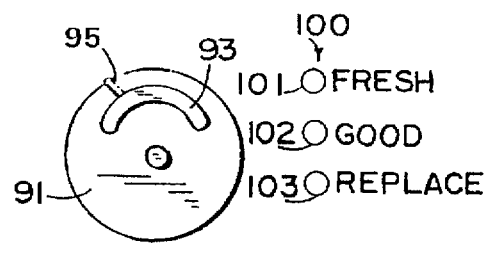
FIG. 6 is a plan view of an end cover having an elongated arcuate measuring device along with a battery status color scale.

FIGS. 5 and 6 are similar to FIG. 4. In FIG. 5, end cover 85 has a single electrochromic cell 87 directly connected to one battery terminal and connected by a suitable circuit means 89 to the opposite terminal of the cell. FIG. 6 shows an end cover 91 with an attached electrochromic cell 93 electrically connected by a suitable conducting means 95 to the opposite terminal of the battery. The electrochromic cells, as shown in FIGS. 5 and 6, would preferably have an associated color scale 100 on the battery label. The color scale has three colored portions 101 to indicate a fresh cell, 102 to indicate a good cell and 103 to indicate a cell which should be replaced. The person using either one of the battery state indicating devices of FIGS. 5 and 6 merely observes the color visible in the cell 89 or 93 and compares it with the color dots of the scale 100 to determine the state of the battery.

As indicated above, the battery state indicating device can be in continuous electrical contact with the external terminals of the battery. Since the testing device does draw current, it is preferred to have some type of an external switch to isolate the testing device from the battery.

Figure 7A:
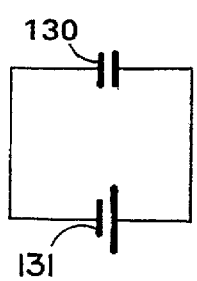
FIG. 7A is a simplified schematic of the electrochromic cell connected for an open circuit test of a battery.
Figure 7B:
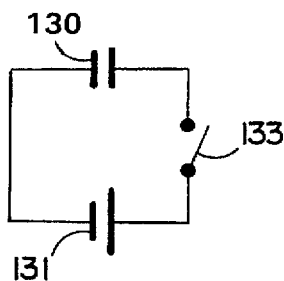
FIG. 7B shows the simplified schematic of FIG. 7A with a switch added to isolate the measuring device from the cell.

The state-of-charge indicating device can be used in either an open circuit or a closed circuit mode. In the closed circuit mode the voltage of the battery is tested under load. FIGS. 7A and 7B show a typical open circuit configuration for testing a battery. In FIG. 7A, electrochromic cell 130 is connected in series with battery 131 to be tested. In FIG. 7B, electrochromic cell 130 is again connected to battery 131; however, in this circuit a switch 133 is used to take the electrochromic testing device out of the circuit so as not to discharge the battery. It can be seen in the open circuit test that no load other than the electrochromic cell itself is placed across the terminals of the battery being tested.

Figure 8:
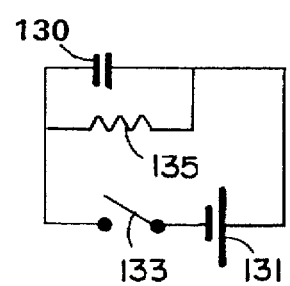
FIG. 8 is a simplified schematic of a closed circuit measuring device.

Referring to FIG. 8, this figure represents a typical closed circuit test in which a load resistor 135 is placed across the electrochromic cell 130. The battery 131 is again connected for testing or isolated by a switch 133.

In the open circuit measurement circuit, as shown in FIGS. 7A and 7B, the electrochromic cell should be poised to sense the range of voltage produced by the battery 131. When a different voltage range is produced by different types of batteries, different electrochromic materials can be used in the electrochromic cell. In the circuit of FIG. 8, the load resistor 135 can be varied to match the electrochromic cell 130 to the potential produced by the battery 131 in addition to selection of the appropriate electrochromic material. The load resistor 135 can be formed using an electrode having intermediate resistivity such as the transparent electrode on the inside of the cover of the electrochromic device. Such an electrode can be shaped or patterned to vary the resistance and serve as the load along which the potential decreases.

Figure 9:
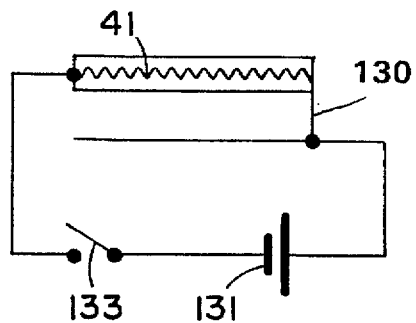
FIG. 9 is a simplified schematic of a device employing a resistive load which is also an electrode of the electrochromic cell.

The selection and matching of the voltage range of the electrochromic material can thus be largely avoided by using a testing circuit such as that shown in FIG. 9 in which the resistivity of the electrode, e.g., the transparent conductive electrode 41, provides the resistive load and, in combination with the electrochromic cell 130, acts a voltage divider. In this cell, the voltage drop across the electrodes of the electrochromic device varies from the closed circuit voltage obtained at the left end of the electrochromic cell, as shown in FIG. 9, to a lower voltage (possibly zero volt) at the other end. With this type of indicator, the state-of-charge of the cell is determined by the position of the color in the electrochromic device.

Figure 10:
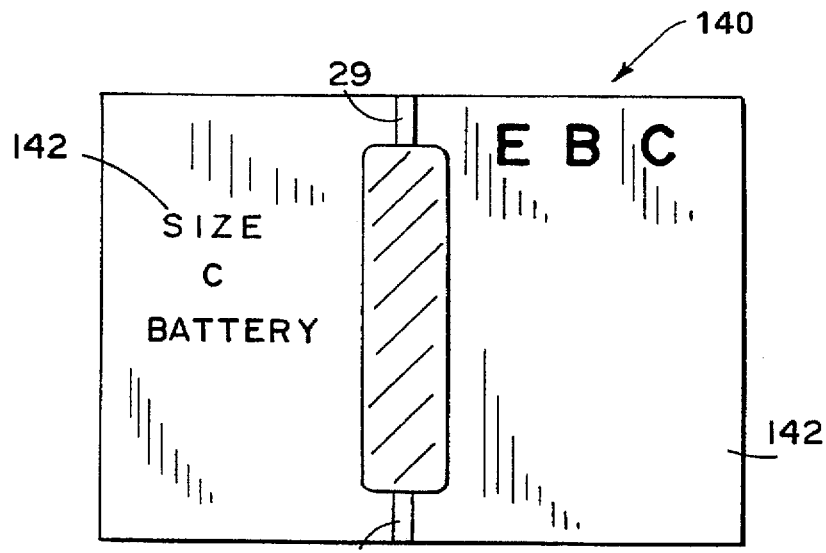
FIG. 10 is a partial elevational view of a label for a battery including a printed battery condition testing device.
Figure 11:
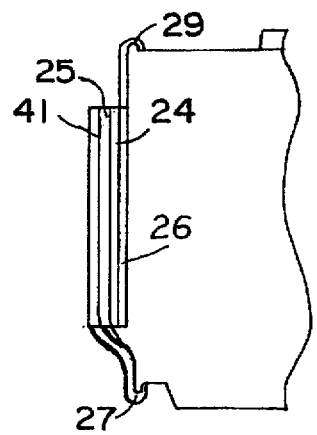
FIG. 11 is a partial sectional view showing the label and battery condition testing device of FIG. 10 applied to a battery.

In an additional embodiment of the tester of the present invention, referring to FIGS. 10 and 11, the several components making up the electrochromic cell can be applied to the label, indicated generally by 140, during the label printing process where appropriate graphics 142 are applied to the label. For example, the electronically conductive members of the electrochromic cell, e.g., the conductive electrodes 26 and 41 and their conductive connective members to the battery, can be provided by various means such as by printing a conductive pattern on a label substrate using conductive ink or paint. Alternatively, conductive patterns can be formed on a conductive substrate by etching techniques to remove unwanted portions and by providing (e.g., by printing) suitable electrical insulation where needed. The solid electrochromic layer 25 can also be printed. The electrolyte layer 24 or electrochemichromic layer (a combination of 25 and 24) can be printed as a solution and then cured or dried. That electrically conductive member, e.g., member 41, through which the electrochromic material can be viewed can be printed in the form of a grid or other open pattern or can be a vapor-deposited optically transparent material.

The label and tester can be prepared so that one electrode of the tester is in electrical contact with one external terminal of the battery. In an embodiment of the tester where the label is made up of several layers, including a metallic layer, the metallic layer can serve as a conductive element or contact to the electrochromic cell. Either electrical conductor 27 or 29 can be printed on the label so that it terminates near one external terminal of the battery without making electrical contact. The other conductor can be printed so that it will make electrical contact with a terminal of the battery when the label is applied. The open circuit can then be closed by bridging an electrically conductive metal article, even the positive external terminal of a second battery, between the conductor on the label and the end cap to activate the tester.

In the manufacture of the label and battery voltage tester, it is preferred to use a web of the substrate material which can hold many labels and run the web through suitable printing operations or coating operations where the graphics for each label can be applied to the web along with each layer of the tester. After the label and testers have been applied, the web of material can be run through a suitable punch or die cutting operation to separate the individual labels from the web so that the labels can be applied to batteries in the finishing of the battery during the heat shrinking of the label.

From the above description it can be seen that a device can be provided for testing the state of a battery which can be applied to the housing or end covers of the battery and left in place at all times. Since the device does not rely on heat, the thermal mass of the battery will not affect the operation of the device. When the electrical circuit for the testing device is completed, the electrochromic material will change color indicating the state of the cell.

Though the invention has been described with respect to a specific preferred embodiment thereof, many variations and modifications will become apparent to those skilled in the art. It is therefore the intention that the appended claims be interpreted as broadly as possible in view of the prior art to include all such variations and modifications.

The embodiments of the invention in which an exclusive property or privilege is claimed are defined as follows:

1. A method of forming an electrochromic thin film, battery state-of-charge detector, said method comprising:
   providing a substrate suitable for affixment to a battery;
   depositing a first electrically conductive pattern on said substrate;
   depositing an electrochromic layer and an electrolyte layer on said substrate;
   depositing a second electrically conductive pattern on at least one of said electrochromic layer and said electrolyte layer, wherein at least one of said electrically conductive materials is a material through which said electrochromic material can be viewed.

2. The method of claim 1 whereby said first electrically conductive pattern is deposited on said substrate by printing.

3. The method of claim 1 whereby said electrochromic layer is deposited on said substrate by printing.

4. The method of claim 1 whereby said electrolyte layer is deposited on said substrate by printing.

5. The method of claim 1 whereby said second electrically conductive pattern is deposited on at least one of said electrochromic layer and said electrolyte layer by printing.

6. The method of claim 1 wherein said electrochromic material is a member selected from the group consisting of $WO_3$, $MoO_3$, $TiO_2$, $SnO_2$, $Cr_2O_3$, $NiO_2$, $Mn_2O_3$, $MnO_2$, and Prussian blue.

7. The method of claim 1 wherein said electrochromic material is a member selected from the group consisting of phenolphthalein, methyl violet, ethyl red, methylene blue, naphthol blue black, N,N-dimethylindoaniline, and N,N'-diphenylbenzidine.

8. The method of claim 1 wherein at least a portion of said substrate is transparent.

9. The method of claim 1 wherein one of said first and second electrically conductive patterns is formed from a transparent metal oxide.

10. The method of claim 1 further comprising:
    connecting a load resistor in parallel to said detector.

11. A method of forming labeled batteries, each comprising an integral battery and electrochromic thin film state-of-charge detector, said method comprising:
    providing a plurality of batteries, each battery having a first terminal, a second terminal, and an exterior surface;
    providing a web of label substrate;
    applying repeated label graphics on said web of label substrate;
    applying repeated label testers at each label graphics, comprising the steps of:
    a) depositing a thin layer of a first electrically conductive material on said web of label substrate;
    b) depositing an electrochromic material and an ionically conductive electrolyte on said first electrically conductive material;
    c) applying to said electrochromic material and said electrolyte a thin layer of a second electrically conductive material, wherein at least one of said electrically conductive materials is a material through which said electrochromic material can be viewed, to thereby form said electrochromic thin film state-of-charge detector;
    d) providing a first electrical conductor for connecting said first electrically conductive material to said first terminal of said battery, and providing a second electrical conductor for connecting said second electrically conductive material to said second terminal of said battery;
    separating said web into individual labels and detectors; and
    affixing each said electrochromic thin film state-of-charge detector and label to said exterior surface of one of said batteries to thereby form each integral battery and electrochromic thin film state-of-charge detector.

12. The method of claim 11 further comprising:
    applying a color scale on at least one of said exterior surface of said battery and said label substrate, whereby said scale can be viewed and compared to said detector to determine the state-of-charge of said battery.

13. The method of claim 11 further comprising:
    printing graphics on said label substrate.

14. The method of claim 11 whereby said depositing of said thin layer of said first electrically conductive material is performed by printing conductive ink or paint on said label substrate.

15. The method of claim 11 whereby said depositing of said electrochromic material is performed by printing said electrochromic material.

16. The method of claim 11 wherein prior to affixing said electrochromic thin film state-of-charge detector to said battery, said web of substrate material containing said plurality of detectors is run through a suitable punch or die cutting operation to separate said plurality of detectors.

17. A method of forming an electrochemichromic thin film state-of-charge detector for on-the-cell application, said method comprising:
    providing a label substrate;
    depositing a layer of a first electrically conductive material on said substrate;
    depositing a layer of an electrochemichromic material on said first electrically conductive material; and
    applying a layer of a second electrically conductive material on said electrochemichromic material, whereby said layers are in a stacked arrangement.

18. A method for preparing a label having a battery condition taster for a battery, said battery including a first and a second external terminal, comprising the following steps:
    providing a label substrate as a film;
    forming on said substrate a layer of a first electronically conductive material;
    applying so as to contact said first electronically conductive material an electrochromic material and an ionically conductive electrolyte;
    applying so as to contact said electrochromic material and said electrolyte a layer of a second electronically conductive material, to thereby form said battery condition tester; and
    providing on said substrate a first electrically conductive means for connecting one of said first and second electronically conductive materials of said battery condition tester to one external terminal of said battery and a second electrically conductive means for connecting the other electronically conductive material to the other external terminal of said battery, and mounting said label substrate to said battery in a manner to be left there in place and to connect at least one of said first and second electrically conductive means to one of said battery terminals and whereby said tester is disposed on said battery;
    said substrate being provided in the form of a web, said web being printed with repeat graphics to form many labels, and a tester for each label, and including the step of separating individual labels from said web and then practicing said step of mounting an individual label to a battery.

19. The method of claim 1 wherein said substrate is provided in the form of a web, said web is printed with repeat graphics to form many labels, said first electrically conductive pattern for each label is deposited on said substrate by printing, said electrochromic layer for each label is deposited on said substrate by printing, said electrolyte layer for each layer is deposited on said substrate by printing, said second electrically conductive layer for each label is deposited on said substrate by printing, and said web is subsequently separated into individual labels with detectors.

* * * * *